US008936488B2

(12) United States Patent
Bahali et al.

(10) Patent No.: US 8,936,488 B2
(45) Date of Patent: Jan. 20, 2015

(54) MEMORY MODULE SOCKET WITH TERMINATING APPARATUS

(71) Applicant: International Business Machines Corporation, Armonk, NY (US)

(72) Inventors: Sumanta K. Bahali, Cary, NC (US); Tony C. Sass, Fuquay Varina, NC (US); Kevin S. D. Vernon, Durham, NC (US); Paul A. Wormsbecher, Apex, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 166 days.

(21) Appl. No.: 13/705,245

(22) Filed: Dec. 5, 2012

(65) Prior Publication Data

US 2014/0153194 A1 Jun. 5, 2014

(51) Int. Cl.
*H01R 12/00* (2006.01)
*H05K 1/18* (2006.01)

(52) U.S. Cl.
CPC .................................... *H05K 1/18* (2013.01)
USPC .................................................... 439/637

(58) Field of Classification Search
USPC ............ 439/637, 60, 188; 200/243; 174/75 B
See application file for complete search history.

(56) References Cited

U.S. PATENT DOCUMENTS 3,903,385 A * 9/1975 Moyer et al. ................. 200/51.1
5,098,306 A 3/1992 Noschese et al.
5,100,342 A * 3/1992 Olsson .......................... 439/497
5,470,243 A 11/1995 Bendorf
5,483,573 A 1/1996 Steenton et al.
5,705,773 A * 1/1998 Smith ......................... 174/75 B
6,058,444 A 5/2000 Johnson
6,089,903 A 7/2000 Stafford Gray et al.
6,105,091 A 8/2000 Long
6,273,759 B1 8/2001 Perino et al.
6,359,233 B1 * 3/2002 Joy et al. ........................ 174/255
6,634,889 B2 * 10/2003 Miller et al. ..................... 439/60
7,029,285 B2 * 4/2006 Abe ................................ 439/62
7,344,402 B2 3/2008 Langgood et al.

(Continued)

OTHER PUBLICATIONS

Kim, "A MLGA Connector for High Speed and High Density"—Proceedings 2001 HD International Conference on High-Density Interconnect and Systems Packaging, Apr. 17-20, 2001, Santa Clara, California, vol. 4428, pp. 149-152 with a cover page.

(Continued)

*Primary Examiner* — Alexander Gilman
(74) *Attorney, Agent, or Firm* — Katherine S. Brown; Jeffrey L. Streets

(57) ABSTRACT

A memory module socket and a terminating resistor assembly. The terminating resistor assembly provides an elongate conductive bus bar and a plurality of conductive branches, wherein each conductive branch is in electronic communication with the elongate conductive bus bar through a resistor, wherein each conductive branch has a distal end disposed for contacting a signal pin within a memory module socket installed on a printed circuit board. A distal end of each conductive branch is inserted into a window on the connector shoulder adjacent to the slot of an empty memory module socket and engages a plurality of signal pins within the socket in response to the absence of a memory module in the slot. The plurality of signal pins engage contact pads on the memory module and are pushed out of contact with the conductive branch in response to the presence of a memory module in the slot.

18 Claims, 7 Drawing Sheets

(56) References Cited

U.S. PATENT DOCUMENTS

| | | | | |
|---|---|---|---|---|
| 7,868,652 | B1 | 1/2011 | Cases et al. | |
| 8,711,547 | B2 * | 4/2014 | Marzano et al. ............. | 361/624 |
| 2010/0291778 | A1 | 11/2010 | Homer et al. | |
| 2012/0268865 | A1 * | 10/2012 | Strebel Marzano et al. .. | 361/624 |

OTHER PUBLICATIONS

Makoto Terao et al., "Adding Filters to Connectors Improves Equipment Performance, Noise Resistance", Hi-Tech Report, JEE Sep. 1994, vol. 31, No. 333, pp. 48-50 with index JEE index page.

* cited by examiner

MEMORY MODULE SOCKET WITH TERMINATING APPARATUS

BACKGROUND OF THE INVENTION

1. Field of the Invention

The present invention relates to memory module sockets and improving signal quality related to memory module sockets.

2. Background of the Related Art

Memory module sockets are used in a computer system to provide communication between memory modules, such as either a single in-line memory module (SIMM) or a dual in-line memory module (DIMM), and a processor package mounted on a printed circuit board. The memory module sockets include pins for physically attaching the sockets to a circuit board. The pins fit through holes in the circuit board and, typically, the pins are either soldered or press-fitted to the board to form a physical connection between the memory module socket and the printed circuit board. The physical connection allows electrical signals to pass between the memory module socket and the processor package on the printed circuit board. When a memory module is received within the memory module socket, the processor package is able to communicate with the module through the socket.

Recent increases in processor performance require higher frequency electrical signals and lower voltages to pass within a memory bus to the memory modules. With lower voltages, electronic "noise" caused by stubs on the printed circuit board has a greater effect on the signal quality. A stub is a trace, pin or a portion of a trace or pin on a printed circuit board that does not connect to another element. For example, a stub can occur in an empty memory module socket and cause noise that can substantially affect the integrity of the communications with memory modules received in adjacent memory module sockets. As a result, signal quality for a populated memory module socket connected in series or parallel with an empty memory module socket may be reduced.

BRIEF SUMMARY OF THE INVENTION

One embodiment of the present invention provides an apparatus, comprising an elongate conductive bus bar and a plurality of conductive branches, wherein each conductive branch is in electronic communication with the elongate conductive bus bar through a resistor, wherein each conductive branch has a distal end disposed for contacting a signal pin within an memory module socket installed on a printed circuit board.

Another embodiment of the present invention provides an apparatus, comprising a memory module socket having a slot for receiving a memory module and a plurality of signal pins disposed in the slot for engaging contact pads on the memory module, and a terminating resistor assembly having an elongate conductive bus bar and a plurality of conductive branches, wherein each conductive branch is in electronic communication with the elongate conductive bus bar through a resistor. Each conductive branch has a distal end disposed for contacting one of the signal pins in response to the absence of a memory module in the slot. In response to the presence of a memory module in the slot, the plurality of signal pins engage contact pads on the memory module and are pushed out of contact with the conductive branch.

DETAILED DESCRIPTION OF THE INVENTION

Figure 1:
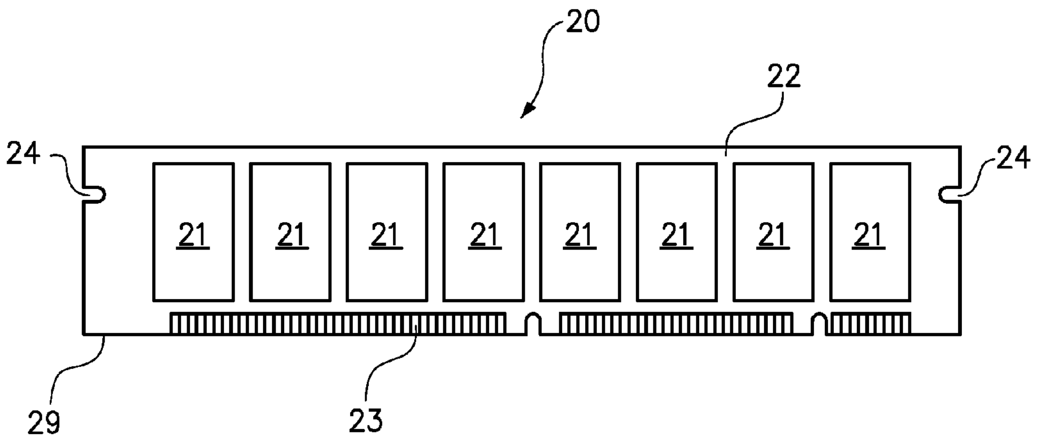
FIG. 1 (PRIOR ART)
FIG. 1 is an elevation side view of a dual in-line memory module (DIMM).

One embodiment of the present invention provides an apparatus, comprising an elongate conductive bus bar and a plurality of conductive branches, wherein each conductive branch is in electronic communication with the elongate conductive bus bar through a resistor, wherein each conductive branch has a distal end disposed for contacting a signal pin within an memory module socket installed on a printed circuit board.

Another embodiment of the present invention provides an apparatus, comprising a memory module socket having a slot for receiving a memory module and a plurality of signal pins disposed in the slot for engaging contact pads on the memory module, and a terminating resistor assembly having an elongate conductive bus bar and a plurality of conductive branches, wherein each conductive branch is in electronic communication with the elongate conductive bus bar through a resistor. Each conductive branch has a distal end disposed for contacting one of the signal pins in response to the absence of a memory module socket in the slot. In response to the presence of a memory module socket in the slot, the plurality of signal pins engage contact pads on the memory module and are pushed out of contact with the conductive branch.

In a further embodiment, each conductive branch is shaped to extend over a top surface of the memory module socket and to dispose the elongate conductive bus bar along a side of the memory module socket. For example, each of the plurality of terminating pins may include a bridging portion shaped to be received and supported on a shoulder of the memory module socket adjacent to a memory module slot. Accordingly, the distal end of each terminating pin may be turned at an angle relative to the bridging portion to extend into a window on the shoulder adjacent to the slot. The bridging portion and the distal end of each terminating pin may collectively form a hook to removably support the apparatus on a shoulder of the socket. Optionally, the distal end of each terminating pin may be wider than the bridging portion of each terminating pin.

Other embodiments of the apparatus include a nonconductive body extending across the plurality of branches, wherein the resistor in each conductive branch is secured in an operable position by the nonconductive body. In one option, the nonconductive body may be overmolded onto the plurality of conductive branches. In another option, each conductive branch comprises a conductive segment on each side of the resistor. A first conductive segment, which may be referred to as a conductive bus bar pin, is secured to the nonconductive body, wherein the conductive bus bar pin has a first end connected to the elongate conductive bus bar and a second end disposed for contact with a first portion of one of the plurality of the resistors. A second conductive segment, which may be referred to as a terminating pin, is also secured to the nonconductive body, wherein the terminating pin has a proximal end disposed for contact with a second portion of one of the plurality of resistors.

Embodiments of the nonconductive body may form a plurality of receptacles, wherein each receptacle is disposed to secure one of the plurality of resistors with the first portion in contact with the second end of the conductive bus bar pin and the second portion in contact with the proximal end of the terminating pin. Optionally, the plurality of receptacles may each be configured to allow a surface mount chip resistor to be surface soldered to the conductive bus bar pin and the proximal end of the terminating pin. In one non-limiting example, each of the plurality of resistors has an electrical resistance in the range of 50 to 250 ohms.

The elongate conductive bus bar, the plurality of conductive bus bar pins, and the plurality of terminating pins should be made of an electrically conductive material that is considered to be a good conductor and selected for use in conducting electricity between discrete elements in electronic circuits. For example, the elongate conductive bus bar, the plurality of conductive bus bar pins, and the plurality of terminating pins may be made of the same or different metals, such as copper or a copper alloy.

FIG. 1 is a side view of a dual in-line memory module (DIMM) 20 having a plurality of contact pads 23 on a first side 22 and aligned along a first edge 29 of the DIMM 20. The DIMM 20 supports a plurality of dynamic random access memory (DRAM) chips 21 thereon in conductive communication with the plurality of contact pads 23 to provide for the flow of data from a memory bus to the DIMM 20 through a DIMM socket (See FIG. 2). Notches 24 may be provided on the DIMM 20 to engage the latches of a DIMM socket into which the DIMM 20 of FIG. 1 may be installed.

Figure 2:
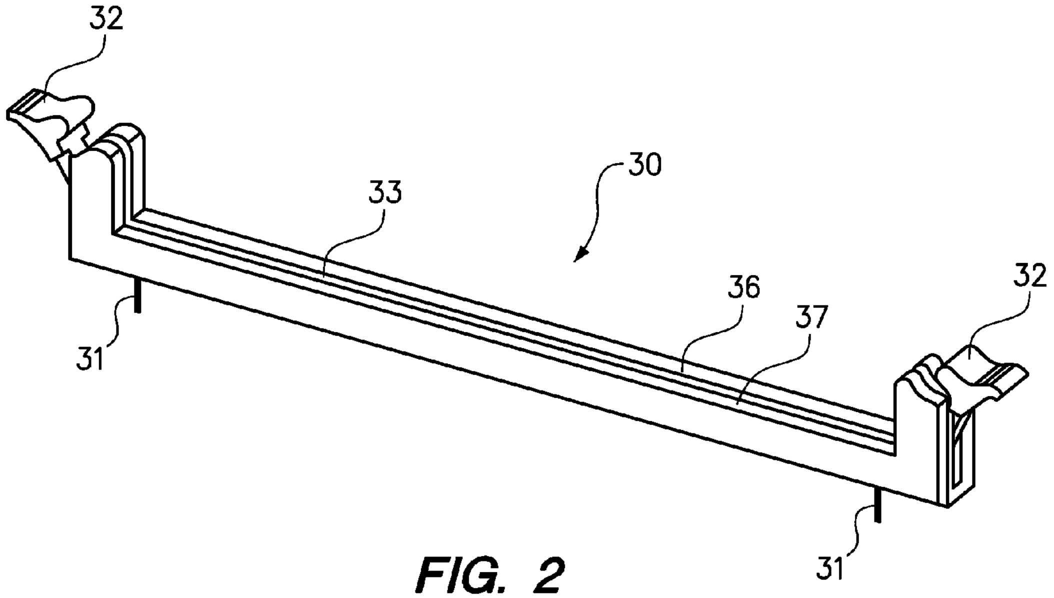
FIG. 2 (PRIOR ART)
FIG. 2 is a perspective view of an uninstalled DIMM socket.

FIG. 2 is a perspective view of a memory module (DIMM) socket 30 adapted to be installed on a printed circuit board (not shown in FIG. 2—see FIG. 3) through anchor pins 31 (only two shown). The anchor pins 31 are sized to be received in holes on a printed circuit board and to connect with conductive traces (not shown) thereon. The DIMM socket 30 comprises retainer clips 32 at each end, an elongate first shoulder 36 and second shoulder 37 extending between the retainer clips, and a DIMM-receiving slot 33 between the first shoulder 36 and second shoulder 37. A typical DIMM socket 30 may comprise from 240 to 300 contact pins (not shown) disposed within the slot 33 to conductively engage contact pads 23 aligned along the edge 29 of the DIMM 20 (see FIG. 1) upon engagement of the DIMM 20 within the slot 33 of the DIMM socket 30.

Figure 3:
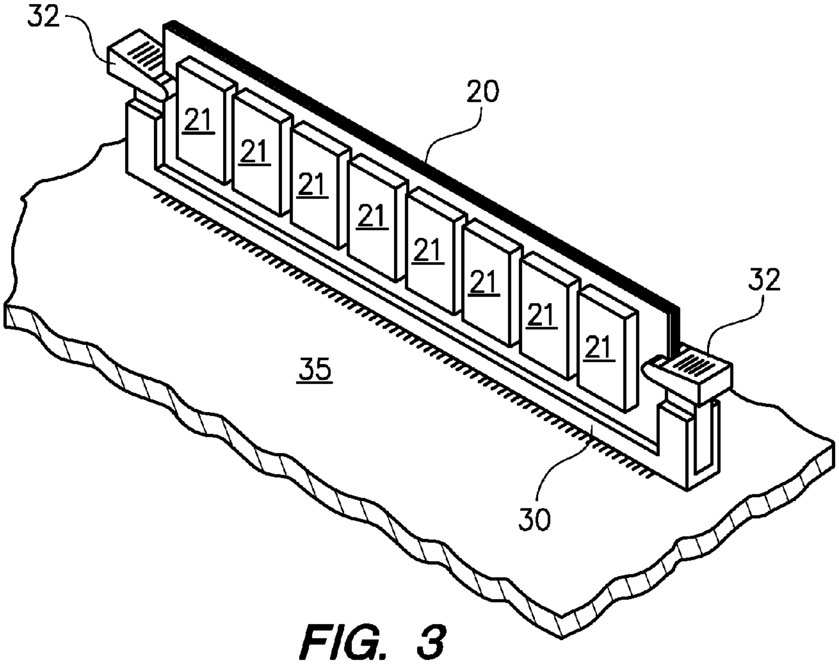
FIG. 3 (PRIOR ART)
FIG. 3 is a DIMM received and secured within a DIMM socket that has been installed on a printed circuit board.

FIG. 3 is a perspective view of the DIMM socket 30 of FIG. 2 installed on a printed circuit board 35 by insertion of anchor pins 31 (not shown) into corresponding holes (not shown) in the printed circuit board 35, and having received and secured a typical DIMM 20. This configuration enables data from a processor via a memory bus (not shown) to be received and stored on the dynamic random-access memory modules (DRAMs) 21 on the DIMM 20 by way of the printed circuit board 35 and the socket 30 and enables data from the DRAMs 21 to be provided through the socket 30 and the printed circuit board 35 to the processor via the memory bus. The DIMM 20 is secured in the engaged position in the slot 33 (not shown) of the DIMM socket 30 using the retainer clips 32.

Figure 4:
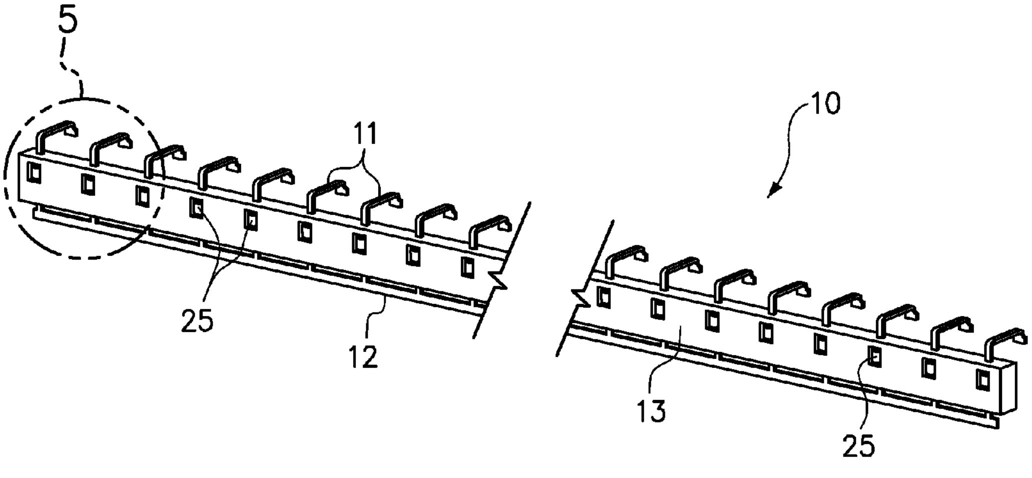
FIG. 4 is a perspective view of an embodiment of a resistor assembly of the present invention.

FIG. 4 is a perspective view of an embodiment of an apparatus (resistor assembly) 10 of the present invention having an elongate conductive bus bar 12, a nonconductive body 13, and a plurality of conductive branches 11 coupled to the elongate conductive bus bar 12 through a plurality of resistors 25.

Figure 5:
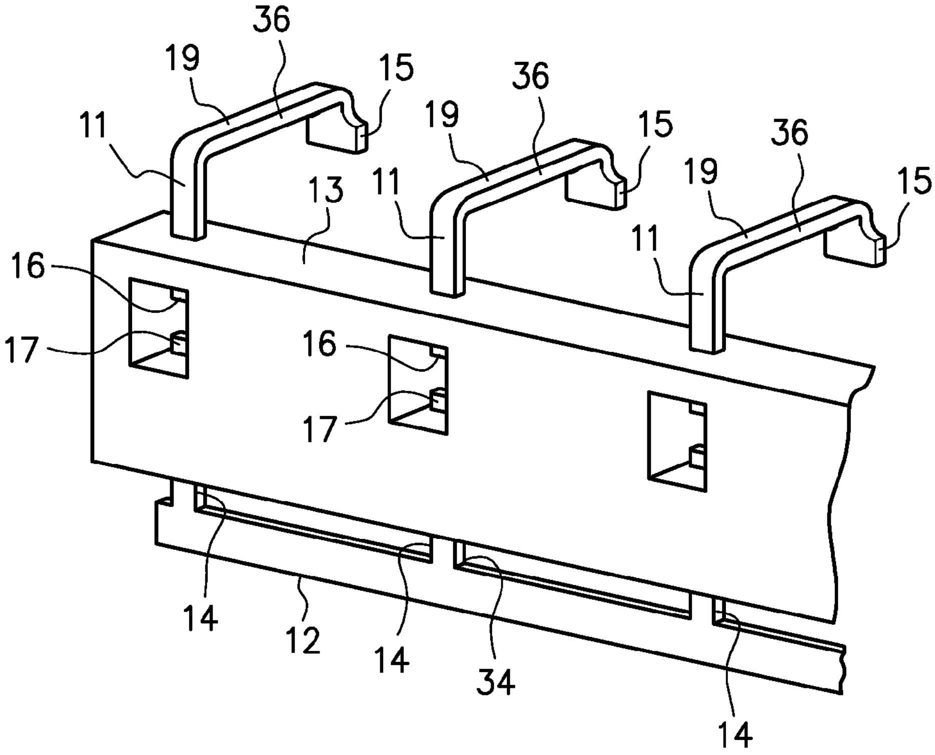
FIG. 5 is an enlarged view of an end portion of the resistor assembly of FIG. 4.

FIG. 5 is an enlarged view of an end portion of the resistor assembly 10 of FIG. 4 revealing the bus bar 12, the nonconductive body 13, and conductive bus bar pins 14 spaced along the length of the bus bar 12. The bus bar pins 14 extend from a first end 34 connected to the bus bar 12 to engage the nonconductive body 13 and to position a second end 17 of the bus bar pins 14 in a resistor receptacle 18 in the nonconductive body 13. The terminating pins 11 also engage the body 13 and have a proximal end 16 positioned adjacent to a resistor receptacle 18 and a distal end 36 extending away from the body 13. Each of the plurality of resistor receptacles 18 is configured to receive a resistor. As shown in FIG. 5, the left-most receptacle has not yet received a resistor in order to illustrate the position of the pin ends 16, 17. The center receptacle shows a surface mount chip resistor 25 (dashed lines) in an installed position soldered in engagement between the second end 17 of a bus bar pin 14 and a proximal end 16 of a terminating pin 11. In this configuration, the resistor 25 is disposed in a conductive path from the first end 36 of the terminating pin 11 to the bus bar 12. The right-most receptacle illustrates a continuous pin for coupling the bus bar 12 to ground, as described more below.

The embodiment of the terminating pins 11 of the apparatus 10 further comprises a downwardly disposed and broadened contact portion 15 at the distal end 36 of the terminating pin 11 to engage a signal pin (not shown) within the DIMM socket 30. The configuration of the broadened contact portion 15 promotes more engagement and/or more tolerant alignment between the terminating pin 11 and the signal pin (not shown) of the DIMM socket 30 (not shown). Each terminating pin 11 of the embodiment of the apparatus 10 of FIG. 5 further comprises a bridging portion 19 intermediate the distal end 36 and the proximal end 16. The bridging portion 19 is configured to cooperate with the broadened contact portion 15 to secure the apparatus 10 on a shoulder of the DIMM socket 30 (as shown in FIGS. 7-10).

The bus bar 12 is terminated to any of the many ground pins provided within a DIMM socket. In other words, the bus bar 12 is grounded using one set of a bus bar pin 17 and a terminating pin 16 aligned therewith. Accordingly, the contact portion 15 of that particular set of aligned pins 16, 17 (illustrated as the right-most set of pins in FIG. 5) is disposed for alignment with a signal pin in the DIMM socket 30 that is itself coupled to ground potential, such as a ground plane within the printed circuit board. To further facilitate the grounding of the bus bar 12, the particular set of aligned pins 16, 17 that is selected for contact with a grounded signal pin may form a continuous or unitary pin with or without a receptacle. Alternatively, a metal bridge or zero-ohm resistor may be soldered into the associated receptacle.

Figure 6:
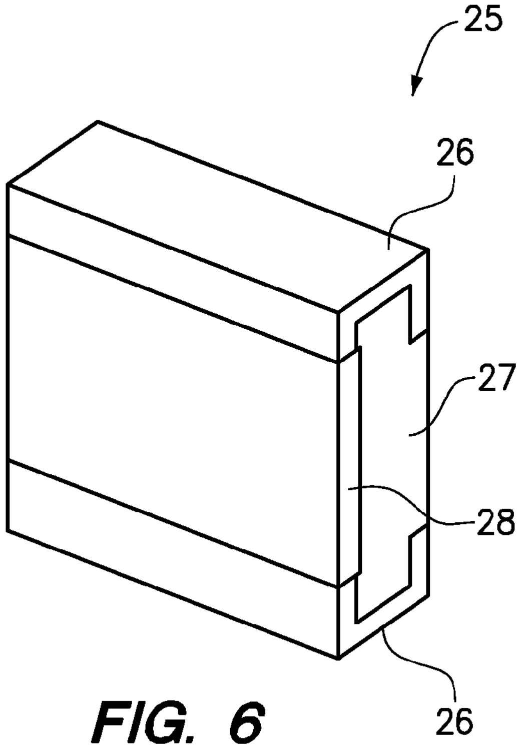
FIG. 6 is a perspective view of one embodiment of a surface mount chip resistor that can be installed in the resistor assembly of FIGS. 4 and 5.

FIG. 6 is a perspective view of an embodiment of a surface mount chip resistor 25, such as a thick film chip resistor, that can be installed in a resistor receptacle 18 of the apparatus 10 of FIGS. 4 and 5. The resistor 25 comprises contact portions 26 on opposing ends that can be soldered to the proximal end 16 of the terminating pin 11 and the second end 17 of the bus bar pin 14, respectively. Between the contact portions 26 is a substrate 27 and a thick film resistive element 28.

Returning to FIG. 5, the proximal end 16 of the terminating pin 11 is positioned in the resistor receptacle 18 and spaced apart from the second end 17 of the bus bar pin 14. The resistor 25 of FIG. 6 may be secured between the terminating pin 11 and the bus bar pin 14 with a first contact portion 26 of the resistor 25 engaging the proximal end 16 of the terminating pin 11 and a second contact portion 26 of the resistor 25 engaging the second end 17 of the bus bar pin 14. In one embodiment of the apparatus 10, the resistor 25 is installed into the resistor receptacle 18 by soldering the resistor between the proximal end 16 of the terminating pin 11 and the second end 17 of the bus bar pin 14.

Figure 7:
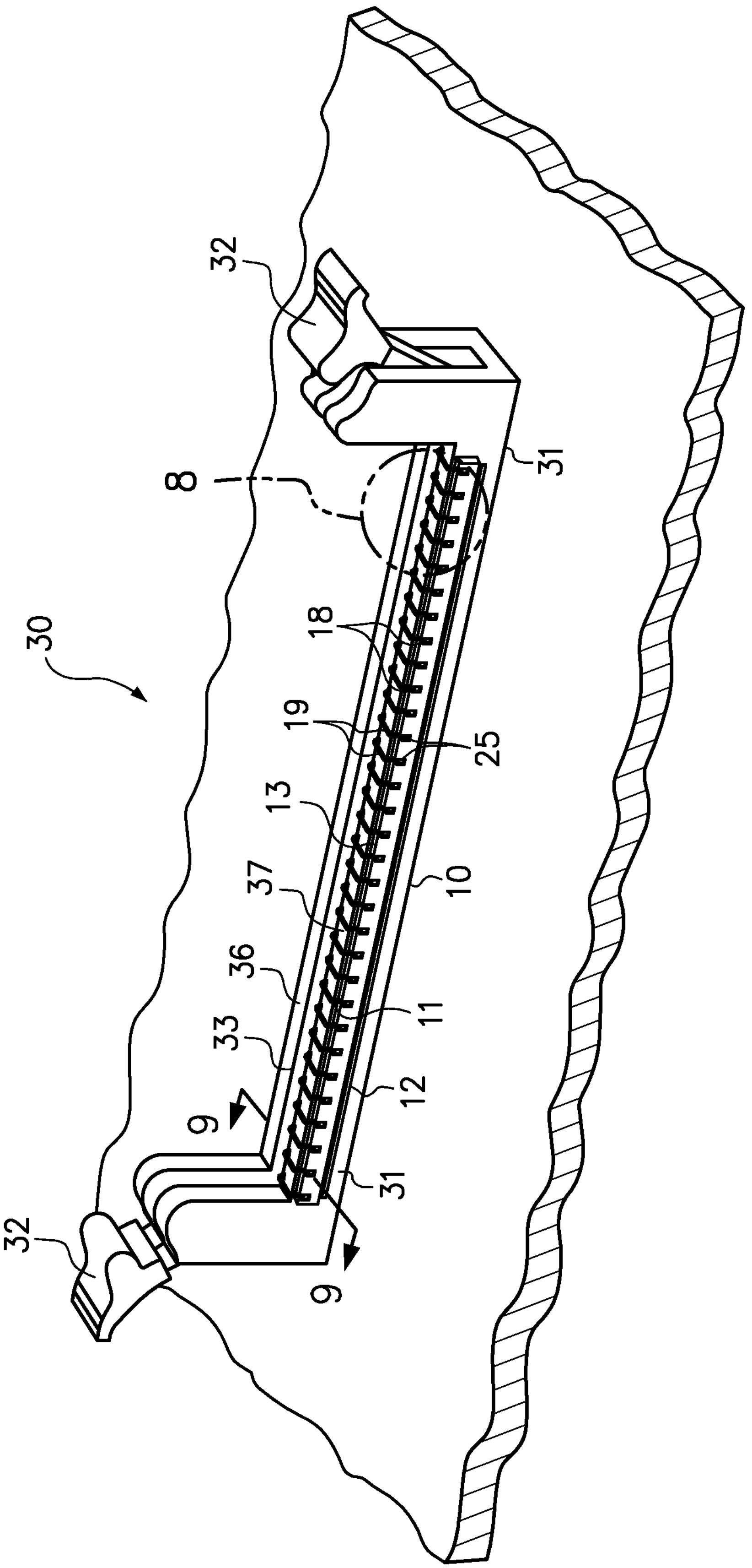
FIG. 7 is a perspective view of a resistor assembly of the present invention, with resistors installed in the resistor receptacles, installed on an empty DIMM socket.

FIG. 7 is a perspective view of an apparatus 10 of the present invention with resistors 25 installed in the resistor receptacles 18 and the apparatus 10 installed on a DIMM socket 30. The bridging portions 19 of the terminating pins 11 are supported on the second shoulder 37 of the DIMM socket 30 with the downwardly disposed broadened contact portion 15 (not shown) of the terminating pins 11 received within a window 50 (not shown) on the first shoulder 36 and on the second shoulder 37 adjacent to slot 33 of the DIMM socket 30. The nonconductive body 13 is supported along and immediately below the second shoulder 37 of the DIMM socket 30 by the terminating pins 11, and the bus bar 12 is supported along and immediately below the nonconductive body 13 by the bus bar pins 14. The retainer clips 32 of the DIMM socket 30 are shown in the open position.

Figure 8:
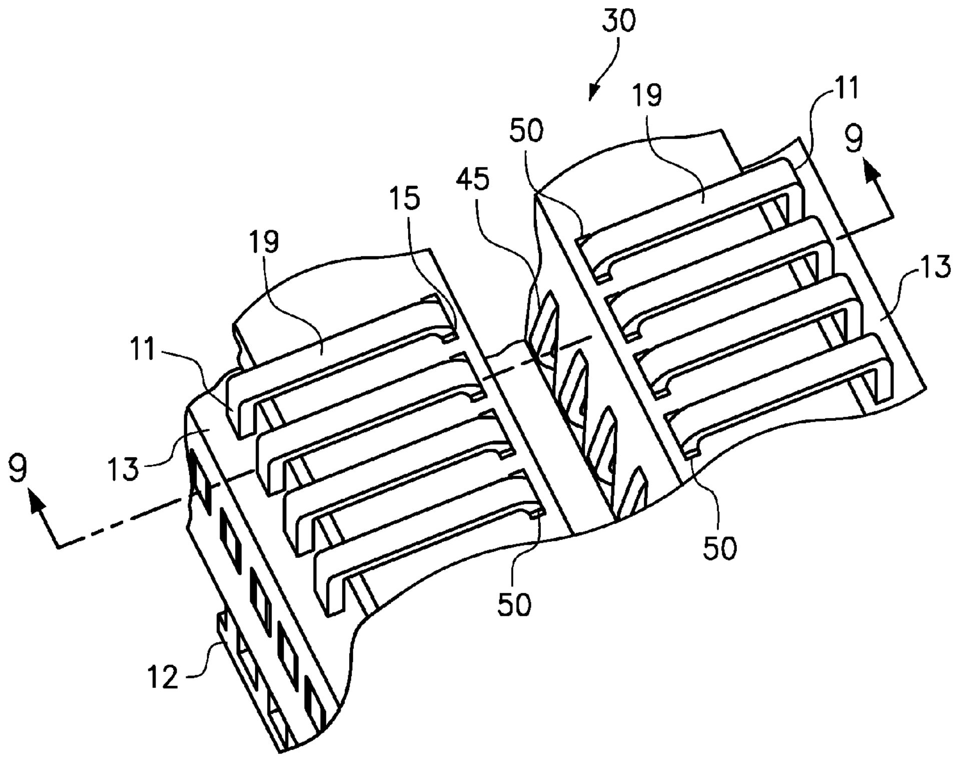
FIG. 8 is an enlarged partial perspective view of the DIMM socket of FIG. 7.

FIG. 8 is an enlarged partial perspective view of the DIMM socket of FIG. 7. The terminating pins 11 extend from the nonconductive body 13 on each side of the DIMM socket 30 such that the bridging portion 19 extends over the top of the socket. The contact portion 15 of each terminating pin 11 is received through a window 50 in the top of the socket 30, so that the contact portion 15 is disposed for selective contact with an aligned signal pin 45. This contact is shown in greater detail in FIG. 9.

Figure 9:
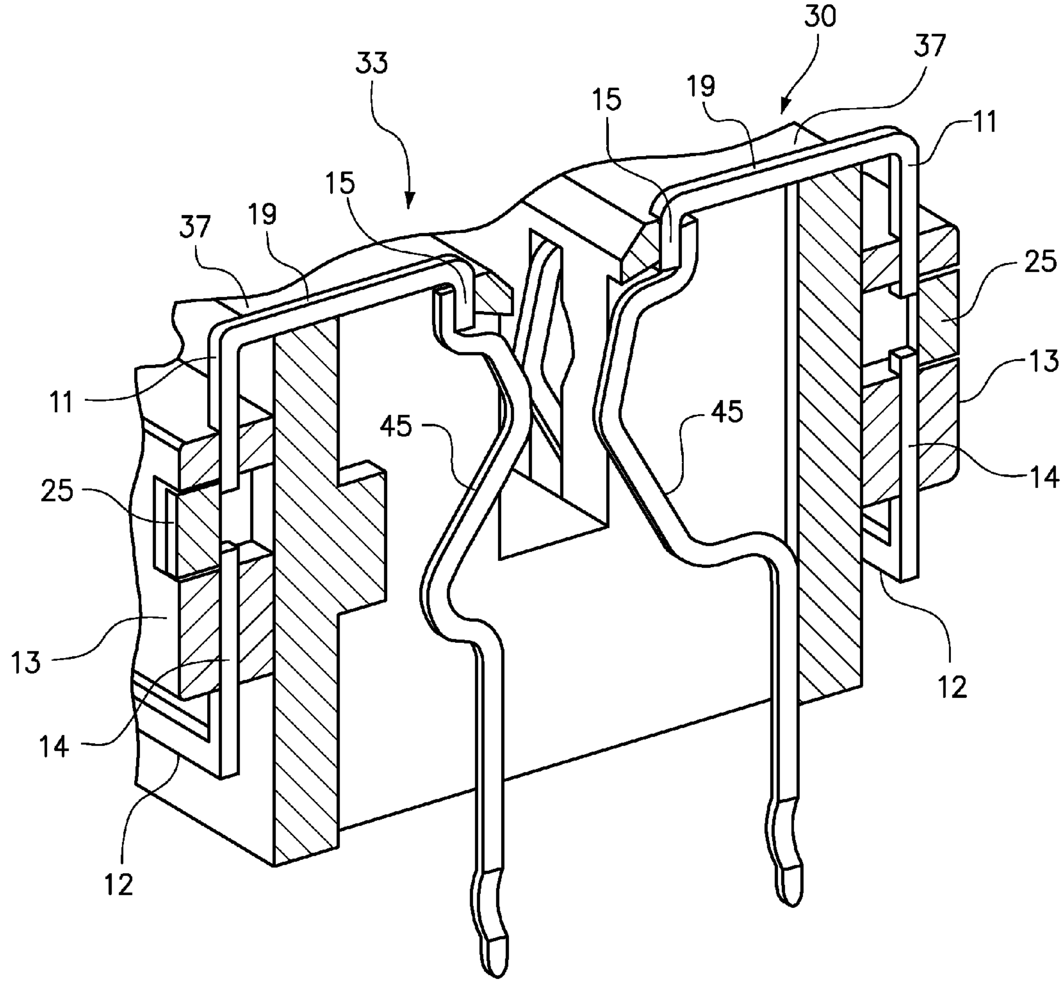
FIG. 9 is an enlarged and sectioned view of the memory module socket without a memory module.

FIG. 9 is an enlarged cross-sectional view of the DIMM socket 30 of FIG. 8 equipped with the terminating resistor apparatus 10 on each side of the socket. In FIG. 9, the socket 30 does not have an installed memory module received with the slot 33, such that the contact portion 15 of the terminating pins 11 make contact with one of the signal pins 45 to effectively prevent the signal pin from being a stub that would induce noise.

The bridging portion 19 of the terminating pin 11 is supported on a shoulder 37 extending along the slot 33 in the DIMM socket 30. The downwardly disposed and broadened contact portion 15 of the terminating pin 11 engages a signal pin 45 within the body of the DIMM socket 30 to conductively connect the signal pin 45 through the terminating pin 11 to the resistor 25. The resistor 25 is received in the resistor receptacle and provides electronic communication with the bar bus 12 through the bar bus pin 14. This configuration provides a conductive pathway from the signal pin 45, through the terminating pin 11, the resistor 25 and the bus bar pin 14 to the bus bar 12 in order to terminate the signal pins 45.

Each resistor 25 of the apparatus 10 of the present invention connects a signal pin 45 of the empty DIMM socket 30 with the bus bar 12 to terminate any signal generated in the signal pin 45 and to thereby prevent unwanted electronic "noise" that might otherwise impair or diminish signal quality to and from adjacent DIMM sockets connected in series or parallel with the empty DIMM socket 30 on which the resistor apparatus 10 is installed. In one embodiment of the apparatus 10, the impedance of the resistors 25 is between 50 and 250 ohms. In many embodiments, the impedance of the resistors 25 is between 50 and 250 ohms to ensure that any signal in the signal pin 45 can be terminated to the bus bar 12. In one embodiment of the resistor assembly 10 of the present invention, the impedance of all resistors 25 is equal. In another embodiment of the resistor assembly 10 of the present invention, the impedance of the resistors 25 varies according to the assessed amount of impedance needed to terminate the signal pin 45 to which that resistor 25 is assigned by its placement within the apparatus 10. However, at least one of the set of pins 11, 14 is used to couple the bus bar 12 to ground, wherein the set of pins is unitary or coupled by a metal bridge or a zero-ohm resistor (see FIG. 5).

Figure 10:
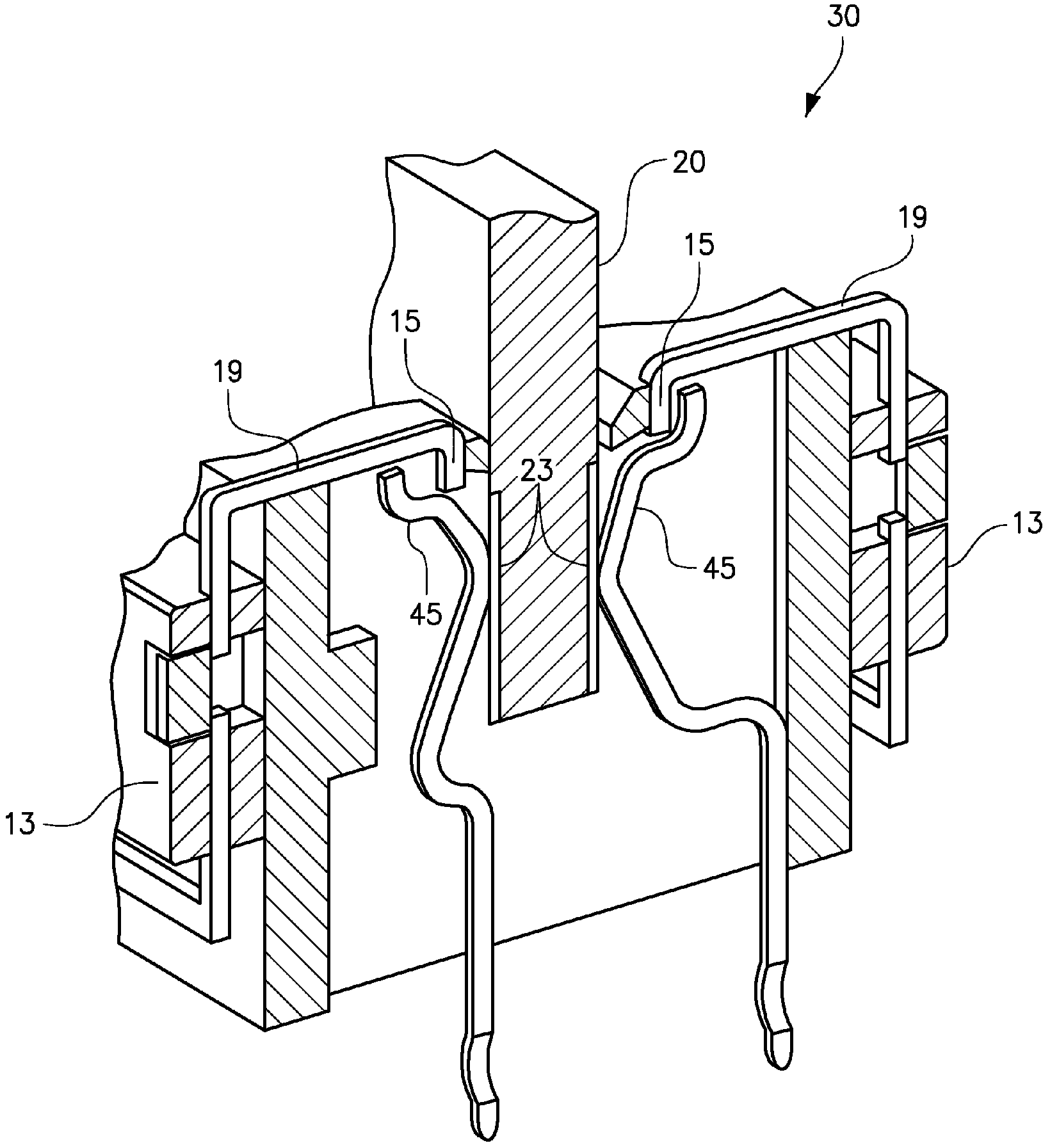
FIG. 10 is an enlarged and sectioned view of the memory module socket after insertion of a memory module.

FIG. 10 is an enlarged and sectioned view of the memory module socket 30, as in FIG. 9, after insertion of a memory module 20 into the slot 33 of the socket 30. The act of inserting the memory module 20 into the socket overcomes a spring force within the contact pins 45 and pushes the contact pins laterally to their respective sides. The contact pin 45 that engaged the contact portion 15 of the terminating resistor apparatus 10 in FIG. 9 has now been pushed out of engagement with the contact portion 15. Furthermore, the contact pin 45 is now in contact with the contact pad 23 that is formed on the memory module 20.

It will be understood that the appended drawings illustrating dual in-line memory modules and dual in-line memory module sockets are used merely for convenience, and that the present invention is not limited to use with dual in-line memory modules. Embodiments of the present invention may be used with memory module sockets configured for receiving and communicating with other types of memory modules including, but not limited to single in-line memory modules.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:

an elongate conductive bus bar; and a plurality of conductive branches, wherein each conductive branch is in electronic communication with the elongate conductive bus bar through a resistor, wherein each conductive branch has a distal end disposed for contacting a signal pin within a memory module socket installed on a printed circuit board.

2. The apparatus of claim 1, wherein each conductive branch is shaped to extend over a top surface of the memory module socket and to dispose the elongate conductive bus bar along a side of the memory module socket.

3. The apparatus of claim 1, further comprising:

a nonconductive body extending across the plurality of branches, wherein the resistor in each conductive branch is secured in an operable position by the nonconductive body.

4. The apparatus of claim 3, wherein the nonconductive body is overmolded onto the plurality of conductive branches.

5. The apparatus of claim 3, wherein each conductive branch comprises:

a conductive bus bar pin secured to the nonconductive body, wherein the conductive bus bar pin has a first end connected to the elongate conductive bus bar and a second end disposed for contact with a first portion of one of the plurality of the resistors; and a terminating pin secured to the nonconductive body, wherein the terminating pin has a proximal end disposed for contact with a second portion of one of the plurality of resistors.

6. The apparatus of claim 5, wherein the nonconductive body forms a plurality of receptacles, wherein each receptacle is disposed to secure one of the plurality of resistors with the first portion in contact with the second end of the conductive bus bar pin and the second portion in contact with the proximal end of the terminating pin.

7. The apparatus of claim 1, wherein each of the plurality of resistors have an electrical resistance in the range of 50 to 250 ohms.

8. The apparatus of claim 6, wherein each of the plurality of receptacles is configured to removably receive one of the plurality of resistors.

9. The apparatus of claim 8, wherein each of the plurality of receptacles is configured to removably receive one of the plurality of resistors with a surface solder attachment.

10. The apparatus of claim 1, wherein the elongate conductive bus bar is made of copper or a copper alloy.

11. The apparatus of claim 5, wherein the terminating pin is made of copper or a copper alloy.

12. The apparatus of claim 5, wherein the conductive bus bar pin is made of copper or a copper alloy.

13. The apparatus of claim 5, wherein the terminating pin includes a bridging portion shaped to be received and supported on a shoulder of the memory module socket adjacent to a memory module slot.

14. The apparatus of claim 13, wherein the distal end of each terminating pin is turned at an angle relative to the bridging portion to extend into a window on the shoulder adjacent to the slot.

15. The apparatus of claim 14, wherein the bridging portion and the distal end of each terminating pin collectively form a hook to removably support the apparatus on a shoulder of the socket.

16. The apparatus of claim 14, wherein the distal end of each terminating pin forms a contact that is wider than the bridging portion of each terminating pin.

17. An apparatus, comprising:

a memory module socket having a slot for receiving a memory module and a plurality of signal pins disposed in the slot for engaging contact pads on the memory module; and a terminating resistor assembly having an elongated conductive bus bar and a plurality of conductive branches, wherein each conductive branch is in electronic communication with the elongate conductive bus bar through a resistor, wherein each conductive branch has a distal end disposed for contacting one of the signal pins in response to the absence of a memory module in the slot, and wherein the plurality of signal pins engage contact pads on the memory module and are pushed out of contact with the conductive branch in response to the presence of a memory module in the slot.

18. The apparatus of claim 17, wherein each conductive branch is shaped to extend over a top surface of the memory module socket and to dispose the elongate conductive bus bar along a side of the memory module socket.

* * * * *